US012707894B2

(12) United States Patent
Tanaka

(10) Patent No.: US 12,707,894 B2
(45) Date of Patent: Aug. 11, 2026

(54) ELEMENT, BOLOMETER, AND ELEMENT MANUFACTURING METHOD

(71) Applicant: NEC Corporation, Tokyo (JP)

(72) Inventor: Tomo Tanaka, Tokyo (JP)

(73) Assignee: NEC CORPORATION, Tokyo (JP)

( * ) Notice: Subject to any disclaimer, the term of this patent is extended or adjusted under 35 U.S.C. 154(b) by 217 days.

(21) Appl. No.: 18/619,395

(22) Filed: Mar. 28, 2024

(65) Prior Publication Data

US 2024/0349610 A1 Oct. 17, 2024

(30) Foreign Application Priority Data

Apr. 14, 2023 (JP) ................................ 2023-066389

(51) Int. Cl.
*H10N 15/10* (2023.01)

(52) U.S. Cl.
CPC .................................. *H10N 15/15* (2023.02)

(58) Field of Classification Search
CPC .............................. H10N 15/10; H10N 15/15
See application file for complete search history.

(56) References Cited

U.S. PATENT DOCUMENTS

2011/0227032 A1* 9/2011 Xia ........................ B82Y 10/00
977/762
2017/0133612 A1* 5/2017 Li ........................ H10K 10/471
2022/0333994 A1* 10/2022 Tanaka ...................... G01J 5/20

FOREIGN PATENT DOCUMENTS

JP 2010-021553 A 1/2010
JP 2010-192901 A 9/2010
JP 2022-025052 A 2/2022

* cited by examiner

*Primary Examiner* — Terrance L Kenerly
(74) *Attorney, Agent, or Firm* — Sughrue Mion, PLLC

(57) ABSTRACT

An element includes a first insulating layer, an intermediate layer which is a nanocarbon-containing film, a second insulating layer, and a contact electrode connected to an intermediate end surface which is an end surface of the intermediate layer, wherein the first insulating layer, the intermediate layer, and the second insulating layer are stacked in order.

8 Claims, 9 Drawing Sheets

ELEMENT, BOLOMETER, AND ELEMENT MANUFACTURING METHOD

CROSS-REFERENCE TO RELATED APPLICATION

Priority is claimed on Japanese Patent Application No. 2023-066389, filed Apr. 14, 2023, the content of which is incorporated herein by reference.

TECHNICAL FIELD

The present disclosure relates to an element, a bolometer, and an element manufacturing method.

BACKGROUND ART

It is known that nanocarbon can be used in infrared sensors such as bolometers.

For example, Japanese Unexamined Patent Application, First Publication No. 2022-25052 (hereinafter Patent Document 1) discloses an electrode formed on a film having a network structure made of carbon nanotubes.

SUMMARY

In the electrode disclosed in Patent Document 1, the electrode is formed on a carbon nanotube film before forming an insulating film. For this reason, since the electrode is formed with the surface of the carbon nanotube film exposed, it may be difficult to form an electrode connected to a nanocarbon-containing film such as a carbon nanotube network.

An example object of the present disclosure is to provide an element, a bolometer, and an element manufacturing method for solving the above-mentioned problem.

An element according to an example aspect of the present disclosure includes a first insulating layer; an intermediate layer which is a nanocarbon-containing film; a second insulating layer; and a contact electrode connected to an intermediate end surface which is an end surface of the intermediate layer, wherein the first insulating layer, the intermediate layer, and the second insulating layer are stacked in order.

An element manufacturing method according to an example aspect of the present disclosure includes forming a first insulating layer; forming an intermediate layer which is a nanocarbon-containing film; forming a second insulating layer; and forming a contact electrode connected to an intermediate end surface which is an end surface of the intermediate layer, wherein the first insulating layer, the intermediate layer, and the second insulating layer are stacked in order.

According to the above aspect, it is easy to form an electrode connected to a nanocarbon-containing film.

EXAMPLE EMBODIMENT

Figure 1:
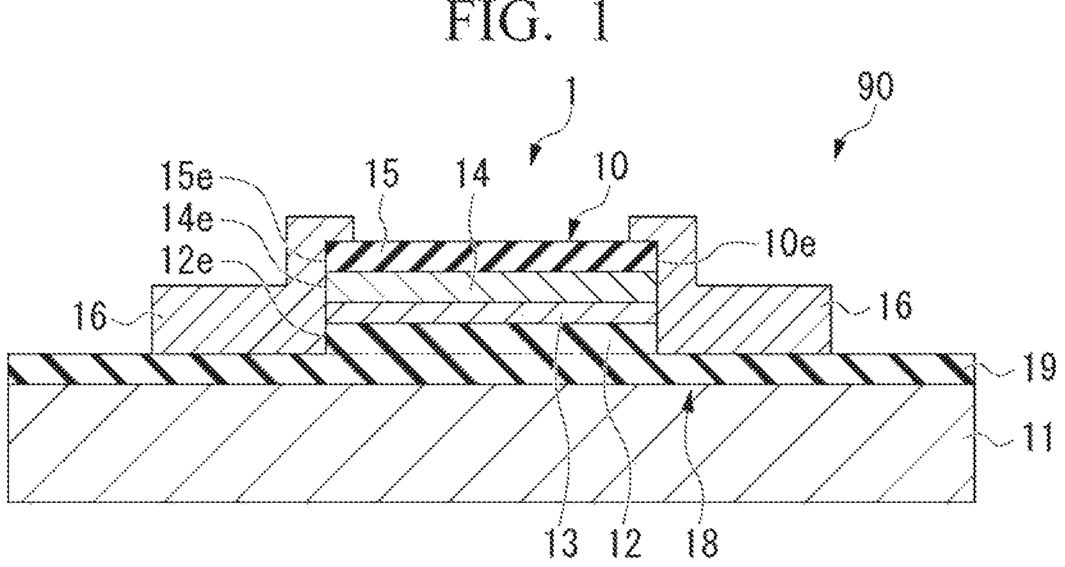
FIG. 1 is a cross-sectional view of a bolometer in some example embodiments of the present disclosure.

Hereinafter, example embodiments according to the present disclosure will be described with reference to the drawings. The drawings and specific configurations used in the example embodiments should not be used to analyze the disclosure. In all of the drawings, the same or equivalent configurations are denoted by the same reference numerals, and common descriptions will be omitted.

Hereinafter, some example embodiments according to the present disclosure will be described with reference to FIGS. 1 to 8.

(Configuration of Bolometer)

As shown in FIG. 1, a bolometer 90 includes an element 1, a substrate 11, and a base insulating layer 19.

The bolometer 90 is used as a sensor for detecting infrared rays.

(Configuration of Substrate)

The substrate 11 is, for example, a Si substrate processed using a silicon wafer.

A readout circuit may be formed on the substrate 11.

(Configuration of Base Insulating Layer)

The base insulating layer 19 is a layered portion extending below the element 1.

The base insulating layer 19 electrically insulates the substrate 11 and the element 1.

(Configuration of Element)

As shown in FIG. 1, the element 1 includes a stacked structure 10 and a contact electrode 16.

The stacked structure 10 includes a first insulating layer 12, a 3-aminopropyl triethoxysilane (APTES) monomolecular film 13, a nanocarbon-containing film 14, and a second insulating layer 15.

The stacked structure 10 has a stacked end surface 10*e* from which the nanocarbon-containing film 14, which is an intermediate layer, is cut out. The stacked end surface 10*e* is cut out in a direction perpendicular to a plane in which layers extend.

For example, the stacked end surface 10*e* from which the nanocarbon-containing film 14 is cut out is cut out in a direction perpendicular to the plane in which the layer extends, but the stacked end surface 10*e* may be cut out at a specific angle with respect to the plane in which the layer extends.

As an example, the specific angle ranges from 40° to 90° with respect to the plane in which the layers extend.

As another example, the specific angle ranges from 40° to 60° with respect to the plane in which the layers extend.

For example, the layer thickness of the stacked end surface 10*e* is 10 nm or more and 1000 nm or less.

The first insulating layer 12 and the base insulating layer 19 are integrally formed as an insulating portion 18.

The first insulating layer 12 is a layered portion of the insulating portion 18 which protrudes toward the nanocarbon-containing film 14.

The base insulating layer 19 is a layered portion of the insulating portion 18 which extends below the first insulating layer 12.

(Insulating Layer)

As shown in FIG. 1, the first insulating layer 12 is formed on the substrate 11 with the base insulating layer 19 interposed therebetween. Methods of forming an insulating film to create the first insulating layer 12 include a method of applying heat treatment to the substrate 11 and forming an insulating film, and a method of directly forming an insulating film using a chemical vapor deposition (CVD) method.

The insulating film is, for example, silicon oxide, silicon nitride, or the like.

The second insulating layer 15 is stacked on the nanocarbon-containing film 14, which will be described later in detail. The second insulating layer 15 is an insulating layer similar to the first insulating layer 12.

For example, the second insulating layer 15 has a thickness of 10 nm or more and 100 nm or less.

(Thin Film Using Silane Coupling Agent)

As shown in FIG. 1, the APTES monomolecular film 13 is stacked on the first insulating layer 12. The APTES monomolecular film 13 is a thin film for improving adhesion performance of carbon nanotubes or the like with respect to an insulating film. The APTES monomolecular film 13 is a silane coupling agent used when attaching the nanocarbon-containing film 14 to the element 1.

(Nanocarbon-Containing Film (Intermediate Layer))

The nanocarbon-containing film 14 is stacked on the first insulating layer 12 via the APTES monomolecular film 13. The nanocarbon-containing film 14 according to these example embodiments is a CNT network film.

For example, the nanocarbon-containing film 14 is a carbon nanotube (CNT) network film in which a plurality of carbon nanotubes are randomly oriented to form a network with each other.

Further, the nanocarbon-containing film 14 is not limited to a CNT network film, and may be a partially or entirely oriented network. Here, nanocarbon refers to a nanosized carbon material containing carbon as a main component, such as single-layered carbon nanotubes, double-layered carbon nanotubes, multi-layered carbon nanotubes, carbon nanohorns, carbon nanobrushes, carbon nanotwists, graphene, and fullerene.

For example, the nanocarbon-containing film 14 may be a film of semiconductor-type nanocarbon.

For example, the nanocarbon-containing film 14 may be a film of semiconductor-type carbon nanotubes.

For example, the nanocarbon-containing film 14 may be a film using semiconducting carbon nanotubes that have been separated into semiconductor-type and metal-type carbon nanotubes.

For example, the nanocarbon-containing film 14 has a thickness of 0.7 nm or more and 10 nm or less.

As shown in FIG. 1, the nanocarbon-containing film 14 is stacked on the APTES monomolecular film 13.

(Contact Electrode)

The contact electrode 16 is connected to the nanocarbon-containing film 14 at the stacked end surface 10*e*.

The contact electrodes 16 are a pair of electrodes that sandwich the stacked structure 10.

For example, the contact electrode 16 is an electrode using Au, Al, Ti, or an alloy mainly containing these.

As an example, the contact electrode 16 may be an electrode in which an Au layer is stacked with a Ti layer interposed therebetween as a base layer.

For example, the contact electrode 16 may be formed such that the pair of electrodes surround the stacked structure 10 in which the first insulating layer 12, the nanocarbon-containing film 14 which is an intermediate layer, and the second insulating layer 15 are stacked in order.

(Manufacturing Method)

A method of manufacturing the element 1 in these example embodiments will be described.

Figure 2:
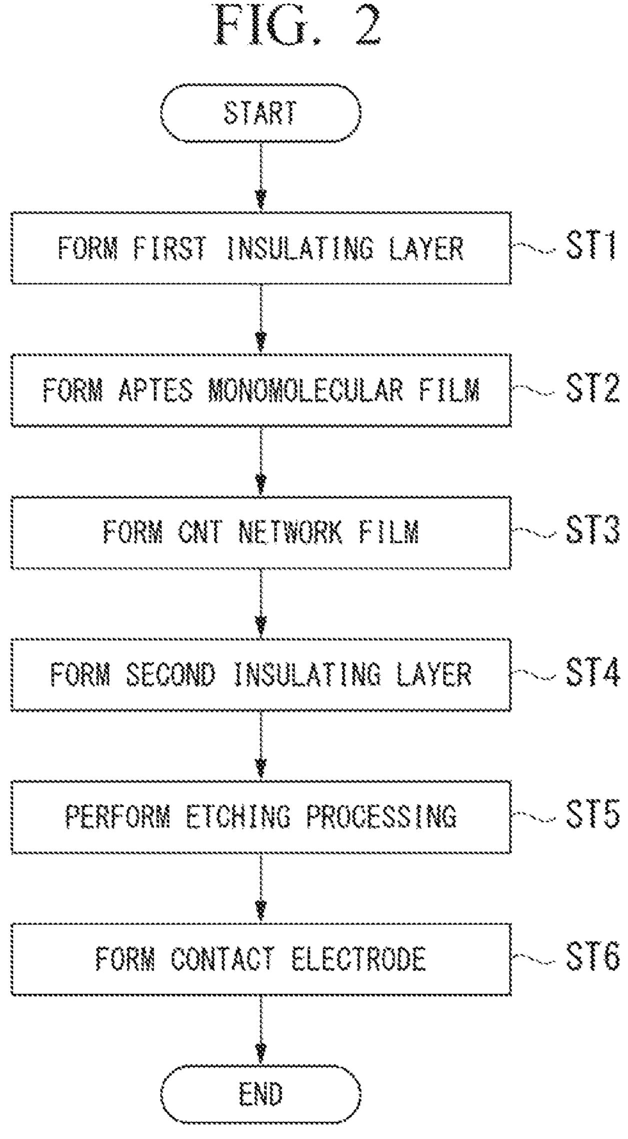
FIG. 2 is a flow diagram of a manufacturing method in some example embodiments of the present disclosure.

The method of manufacturing the element 1 in these example embodiments is performed in accordance with a flow shown in FIG. 2.

Figure 3:
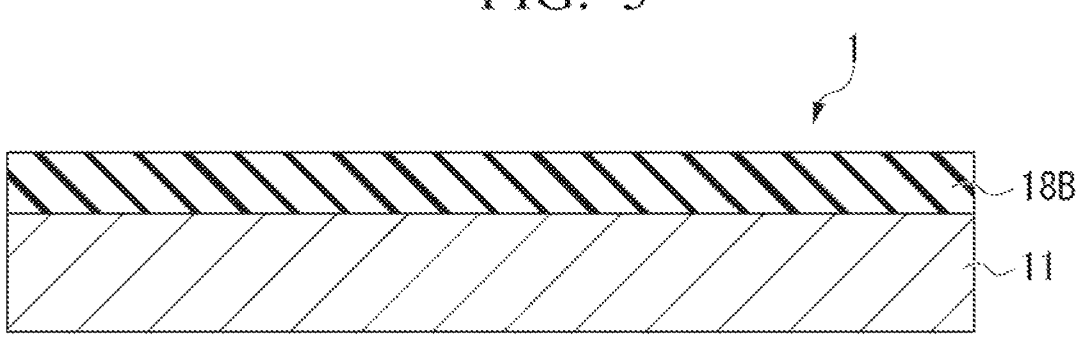
FIG. 3 is a cross-sectional view of stacked layers immediately after a first insulating layer is formed in the some example embodiments of the present disclosure.

First, as shown in FIG. 3, an operator stacks a layered pre-cutting insulating portion 18B including the first insulating layer 12 on the substrate 11 (ST1). The operator stacks the pre-cutting insulating portion 18B by forming a thermal oxide film on the substrate 11 by CVD or heat treatment.

When an insulating protection film is already provided on the substrate 11, ST1 may not be performed.

The pre-cutting insulating portion 18B is not necessarily stacked on the substrate, and may be stacked on other materials.

Figure 4:
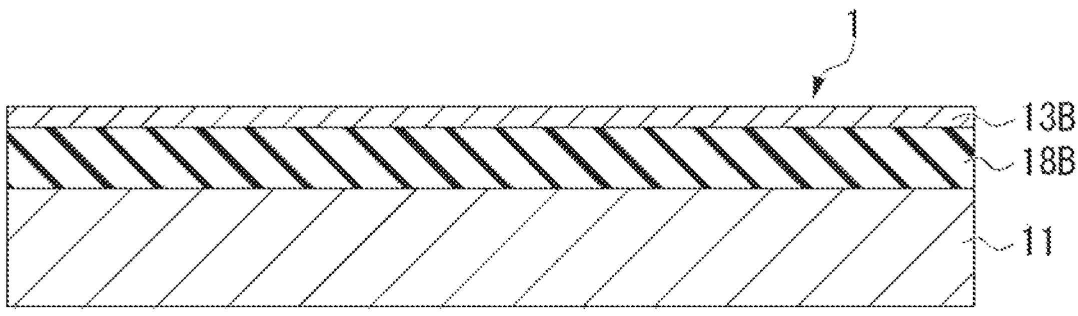
FIG. 4 is a cross-sectional view of the stacked layers immediately after an APTES monomolecular film is formed in some example embodiments of the present disclosure.

Next, as shown in FIG. 4, the operator forms a pre-cutting APTES monomolecular film 13B including the APTES monomolecular film 13 on the layered pre-cutting insulating portion 18B including the first insulating layer 12 (ST2).

As a method of stacking the pre-cutting APTES monomolecular film 13B, an operator immerses the substrate 11 on which the pre-cutting insulating portion 18B is stacked in a dispersion of APTES monomolecules, and forms the pre-cutting APTES monomolecular film 13B in the pre-cutting insulating portion 18B.

Figure 5:
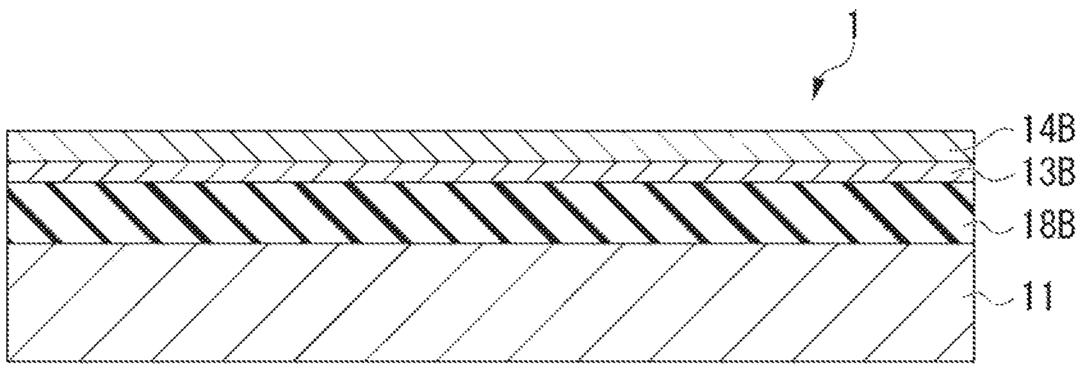
FIG. 5 is a cross-sectional view of the stacked layers immediately after a nanocarbon-containing film is formed in some example embodiments of the present disclosure.

Next, as shown in FIG. 5, the operator stacks a pre-cutting nanocarbon-containing film 14B including the nanocarbon-containing film 14, which is a CNT network film, on the pre-cutting APTES monomolecular film 13B. By using a silane coupling agent, the pre-cutting nanocarbon-containing film 14B can be stacked with high density on the layered pre-cutting insulating portion 18B including the first insulating layer 12 (ST3).

As a method of stacking the pre-cutting nanocarbon-containing film 14B, the operator immerses the substrate having been processed in ST2 in a dispersion in which carbon nanotubes are isolated and dispersed, and then stacks the pre-cutting nanocarbon-containing film 14B.

Figure 6:
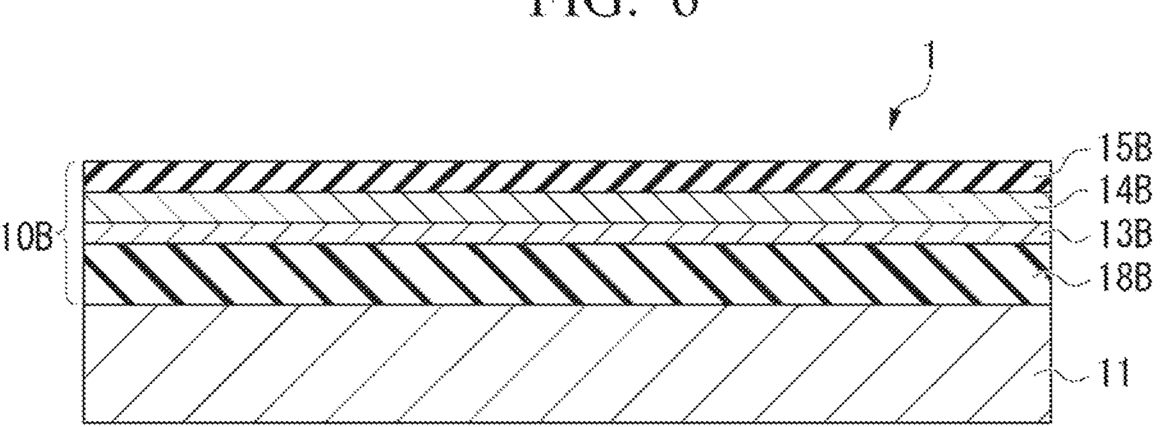
FIG. 6 is a cross-sectional view of the stacked layers immediately after a second insulating layer is formed in some example embodiments of the present disclosure.

Next, as shown in FIG. 6, the operator stacks a pre-cutting second insulating layer 15B including the second insulating layer 15 on the pre-cutting nanocarbon-containing film 14B (ST4).

The operator directly stacks the pre-cutting second insulating layer 15B on the pre-cutting nanocarbon-containing film 14B by a film formation method such as CVD, sputtering, or liquid phase growth, which is less likely to cause damage to the pre-cutting nanocarbon-containing film 14B.

For example, as a film formation method that is less likely to cause damage, the operator directly stacks the pre-cutting second insulating layer 15B on the pre-cutting nanocarbon-containing film 14B by a CVD method using a tetraethoxysilane (TEOS) gas in an oxygen-free atmosphere.

For example, as a film formation method that is less likely to cause damage, the operator directly stacks the pre-cutting second insulating layer 15B on the pre-cutting nanocarbon-containing film 14B by a sputtering method in an Ar-only atmosphere.

Thereby, a pre-cutting stacked structure 10B in which the layered pre-cutting insulating portion 18B including the first insulating layer 12, the pre-cutting APTES monomolecular film 13B, the pre-cutting nanocarbon-containing film 14B, and the pre-cutting second insulating layer 15B are stacked in order is formed.

Figure 7:
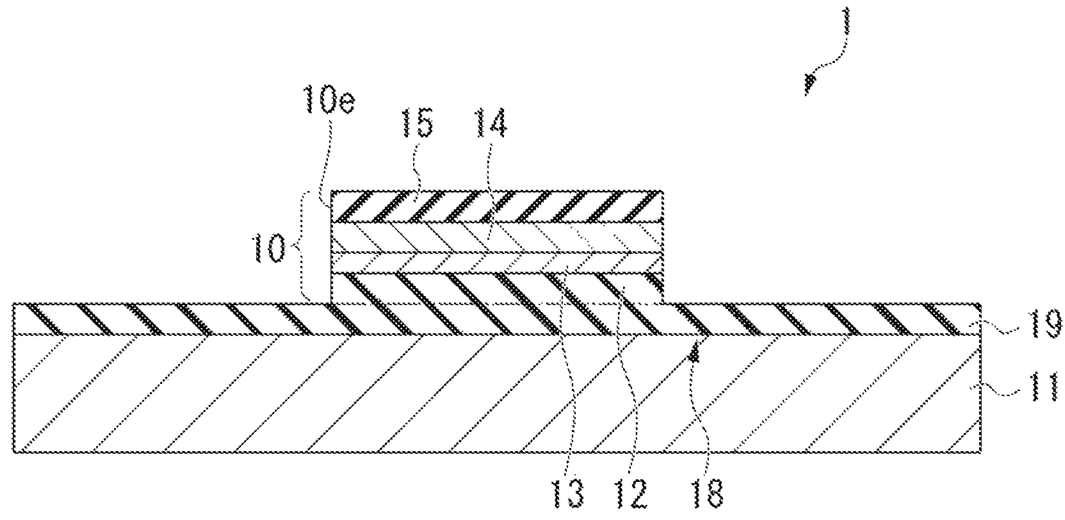
FIG. 7 is a cross-sectional view of the stacked layers immediately after etching processing is performed in some example embodiments of the present disclosure.

Next, as shown in FIG. 7, the operator performs etching processing on the pre-cutting stacked structure 10B formed through ST1 to ST4 in order to form the stacked end surface 10*e* (ST5). The etching processing follows a known general-purpose process.

As a result of the etching, the stacked structure 10 that is cut out has the stacked end surface 10*e* that is cut out from the first insulating layer 12 to the second insulating layer 15. At this time, the nanocarbon-containing film 14, which is an intermediate layer of the stacked structure 10, is cut out and exposed.

In the stacked end surface 10*e* of the present disclosure, a first end surface 12*e* of the first insulating layer 12, an intermediate end surface 14*e* of the nanocarbon-containing film 14 as an intermediate layer, and a second end surface 15*e* of the second insulating layer 15 may be continuous with each other.

Figure 8:
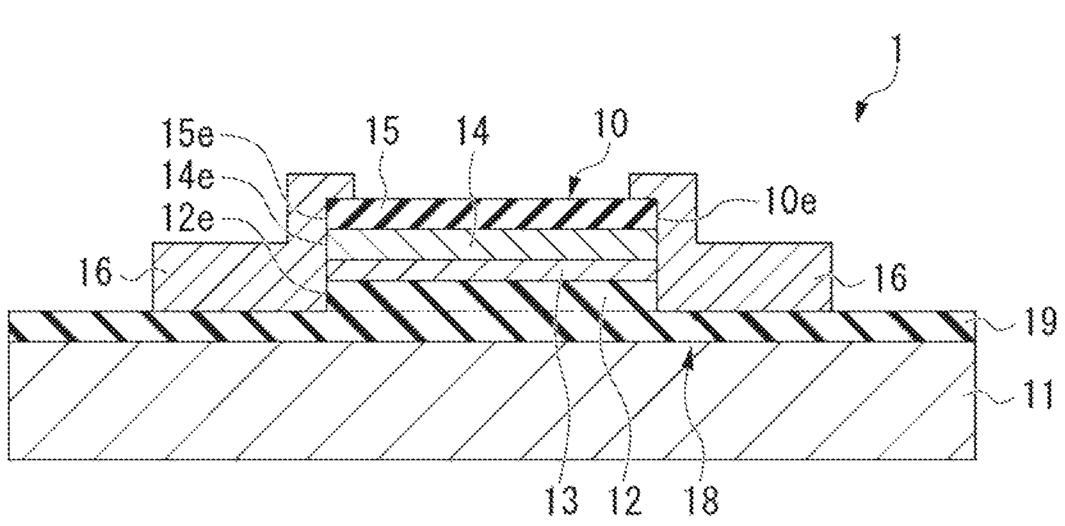
FIG. 8 is a cross-sectional view of the stacked layers immediately after a contact electrode is formed in some example embodiments of the present disclosure.

Next, as shown in FIG. 8, the operator forms the contact electrode 16 by sputtering or the like (ST6). The contact electrode 16 is formed to be connected to the nanocarbon-containing film 14 that is exposed in ST5. In the present disclosure, the operator forms the contact electrode 16 in contact with the nanocarbon-containing film 14 so as to cover the stacked end surface 10*e*.

Further, the operator forms the contact electrode 16 so that the contact electrode 16 overlaps the surface of the second insulating layer 15, which is the surface of the stacked structure 10, and the upper portion of the contact electrode 16 partially extends.

Further, the length of the extended upper portion of the contact electrode 16 that extends to overlap the surface of the second insulating layer 15 is appropriately set to be such a length as to be able to control an electric field of a contact part between the intermediate end surface 14*e* of the nanocarbon-containing film 14 and the contact electrode 16 at the stacked end surface 10*e*.

Although the element 1 of the present disclosure is used in a bolometer, it is not particularly limited thereto.

The element 1 of the present disclosure is used in a gas sensor, a thin film transistor (TFT), a pressure sensor, and the like in addition to the bolometer. In this case, the element 1 may not include the substrate 11 and the base insulating layer 19.

Figure 9:
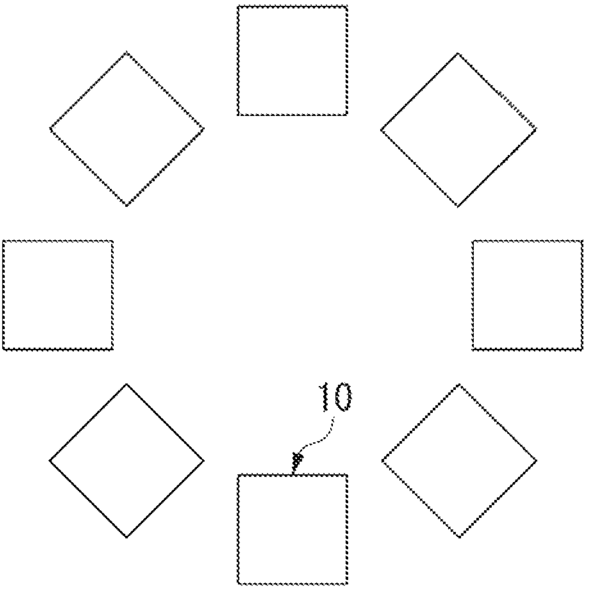
FIG. 9 is a plan view of a stacked structure of an element after etching.

FIG. 9 is a diagram of the stacked structure of the element 1 after etching when viewed from directly above.

After etching, the element 1 is separated, and an end surface of a nanocarbon-containing film is exposed.

As shown in FIG. 9, a plurality of elements 1 may be formed radially or in a specific pattern.

Figure 10:
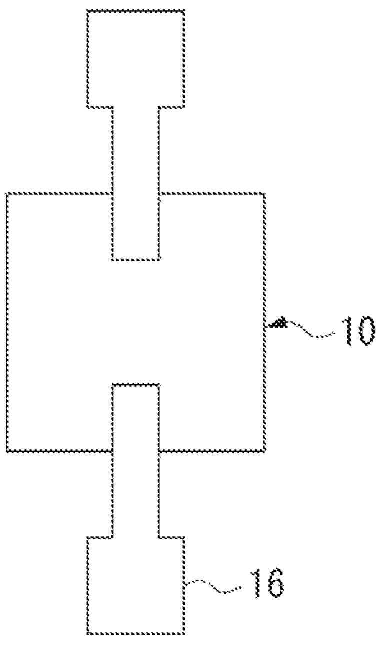
FIG. 10 is a plan view of the element after an electrode is formed.

FIG. 10 is a diagram of the element 1 after an electrode is formed when viewed from directly above.

As shown in FIG. 10, the contact electrode 16 may be formed over a certain portion on one side of the stacked structure 10 of the element 1.

(Actions and Effects)

According to the element 1 of these example embodiments, an electrode is formed by stacking the second insulating layer 15 on the nanocarbon-containing film 14 and cutting out the stacked structure 10 including these to expose the end surface thereof.

For this reason, the operator can form the contact electrode 16 with the surface of the nanocarbon-containing film 14 covered with the second insulating layer 15, and thus it is possible to suppress an influence on the nanocarbon-containing film 14 when the contact electrode is formed.

Thus, according to the element 1 of the present disclosure, it is easy to form an electrode connected to a nanocarbon-containing film.

According to the element 1 of these example embodiments, an electrode is formed by stacking the second insulating layer 15 on the nanocarbon-containing film 14 and cutting out the stacked structure 10 including these to expose the end surface thereof. For this reason, the nanocarbon-containing film is less likely to be damaged during etching when stacking a metal film for electrodes or during ashing for removing resist residues after lift-off.

Figure 11:
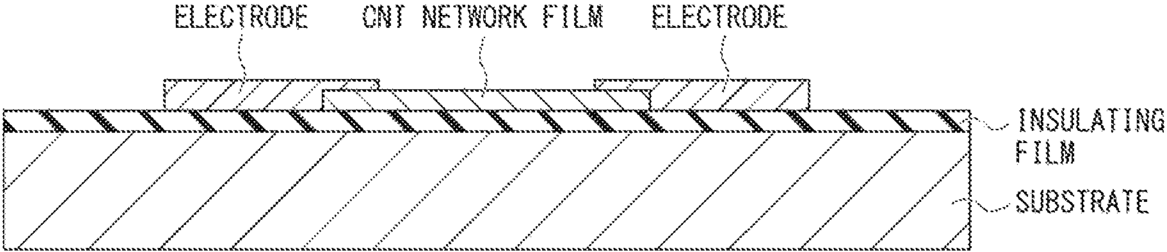
FIG. 11 is a cross-sectional view (A) of stacked layers of an element in a comparative example.
Figure 12:
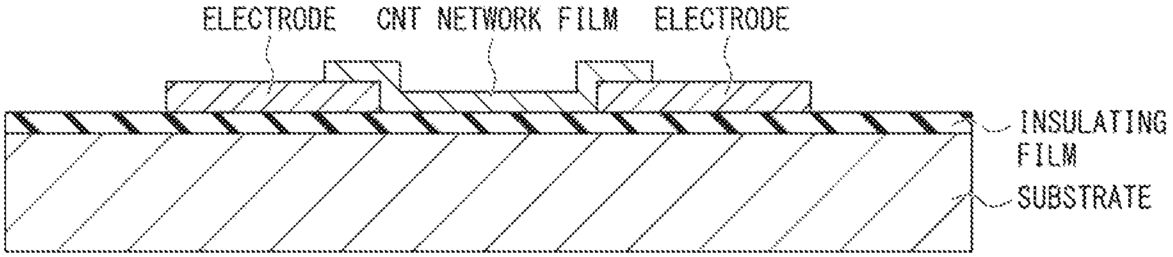
FIG. 12 is a cross-sectional view (B) of stacked layers of an element in a comparative example.

FIGS. 11 and 12 show comparative examples.

As shown in FIGS. 11 and 12, even in these comparative examples, there is a CNT network formed by randomly dispersing on a substrate. In order to utilize the electrical properties of the CNT network, it is necessary to form a contact electrode so as to be electrically connected to the CNT network. In these comparative examples, the following two methods are conceivable as a procedure for forming the contact electrode.

A first method is a method of first forming a CNT network and then forming a contact electrode, as in the comparative example of FIG. 11. Conceivable methods for this method include a method (A) in which a metal film for a contact electrode is formed over the entire surface and then patterned by etching, and patterning formation (B) of an electrode by lift-off.

In the method (A) in which the metal film is patterned by etching, an electrode to be etched is present directly above a CNT network film. For this reason, there is a possibility that nanocarbon will be damaged during etching, which is a problem.

Furthermore, in the patterning formation (B) of the electrode by lift-off, a resist film is formed directly on the CNT network film at the time of forming the element shown in FIG. 11. For this reason, carbon nanotubes and a resist come into contact with each other. In a typical semiconductor process, resist residues after lift-off are cleaned by oxygen plasma ashing or the like. When ashing is performed, it is difficult to remove a resist attached to the surface of carbon nanotubes without damaging nanocarbon.

In contrast to this comparative example, in the example of these example embodiment, an electrode is formed by stacking the second insulating layer 15 on the nanocarbon-containing film 14, which is a CNT network film, and then cutting out the stacked structure 10 including these to expose the end surface thereof.

For this reason, an insulating layer is provided directly above the nanocarbon-containing film 14 during etching, and thus it is possible to configure a structure in which damage to the nanocarbon is less likely to occur.

The insulating layer is provided directly above the nanocarbon-containing film 14 also when performing ashing for removing resist residues after lift-off, and thus it is possible to expect the same effect.

A second method is a method of first forming a contact electrode and then forming a CNT network, as in the comparative example of FIG. 12.

With this method, the following three problems (I, II, III) are conceivable.

First, in an element after the formation, a difference in level occurs between a CNT network film and the CNT network film attached directly above the electrode. Although the height of the difference in level is determined by the thickness of the electrode, it can be considered that the height of the difference in level has a large influence on the electrical characteristics for carbon nanotubes with a diameter of 1 nm and a length of several um. That is, the resistance value of the element itself created by this method may be affected (I).

Next, there is a difference in an adhesion condition of carbon nanotubes on an insulating film and on a metal. Thereby, a situation in which it is difficult to electrically connect the CNT network film and the electrode may occur (II).

Thirdly, as in the comparative example of FIG. 11, there is a possibility of damaging the nanocarbon during patterning of the CNT network film (III).

In contrast to this comparative example, in the example of these example embodiments, a contact electrode is formed on the exposed nanocarbon-containing film 14, making it easier to secure electrical connection.

In contrast to this comparative example, in the example of these example embodiments, the electrode is formed by stacking the second insulating layer 15 on the nanocarbon-containing film 14 and then cutting out the stacked structure 10 including these to expose the end surface thereof, and thus it is difficult to damage nanocarbon.

For this reason, the three problems described above can be avoided.

In the contact electrode 16 of the element 1 according to the present disclosure, the intermediate end surface 14*e* of the nanocarbon-containing film 14, which is an intermediate layer, is exposed.

For this reason, the element 1 according to the present disclosure can easily secure electrical connection.

In the element 1 according to the present disclosure, the first end surface 12*e*, the intermediate end surface 14*e*, and the second end surface 15*e* are continuous.

Thereby, the nanocarbon on the intermediate end surface 14*e* is protected by the first end surface 12*e* and the second end surface 15*e*.

Thus, the electrode can be formed in a state where the surface of the nanocarbon-containing film 14 is reliably protected by two insulating layers, and thus it is possible to suppress the influence on the nanocarbon during the formation of the electrode.

The contact electrode 16 of the element 1 according to the present disclosure extends to overlap the surface of the second insulating layer 15.

Thereby, an electric field at a contact point between the intermediate end surface 14*e* of the nanocarbon-containing film 14 and the contact electrode 16 on the stacked end surface 10*e* can be controlled.

Thus, the contact electrode 16 can reduce a Schottky barrier at the contact point with the nanocarbon-containing film 14, for example.

In the element 1 according to the present disclosure using semiconductor-type carbon nanotubes, an insulating layer is formed on the nanocarbon-containing film 14, and then an electrode is formed, thereby making it difficult to damage the nanocarbon during manufacturing.

For this reason, stable manufacturing and supply of electronic components such as a bolometer and a thin film transistor can be expected.

In the element 1 according to the present disclosure, a silane coupling agent is used at the time of attaching the nanocarbon-containing film 14 to the element 1, and thus it is possible to form a network of nanocarbons in which the density of nanocarbons at the time of the attaching is increased.

According to the bolometer 90 of these example embodiments, it is possible to expect an improvement in detection performance in addition to the effects of the element 1 described above.

As a comparative example, compared to an element including an intermediate layer made of vanadium oxide (or amorphous silicon), the bolometer 90 of these example embodiments includes an intermediate layer containing nanocarbon such as carbon nanotubes, which has a temperature coefficient of resistance higher than that of vanadium oxide (or amorphous silicon), and thus it is possible to expect an improvement in detection performance.

In the example of the above-described example embodiments, the APTES monomolecular film 13 is used in the stacked structure 10, but the APTES monomolecular film 13 may be replaced with another one. Alternatively, a silane coupling agent such as the APTES monomolecular film 13 may not be used to attach the nanocarbon-containing film 14.

In the example of the above-described example embodiments, the contact electrode 16 partially extends so as to cover the upper surface of the second insulating layer 15, but the contact electrode 16 may not extend or cover the upper surface.

In the example of the above-described example embodiments, the stacked structure 10 includes a single layer of the nanocarbon-containing film 14. However, the stacked structure 10 may include two or more nanocarbon-containing films 14. At this time, each of the nanocarbon-containing films 14 is configured such that an insulating layer is formed in the upper and lower layers thereof.

The stacked structure 10 includes two or more nanocarbon-containing films 14, and thus has a plurality of structures in which nanocarbons are arranged in a stacking direction. The stacked end surface 10*e* obtained by cutting out the stacked structure 10 of this modification example is connected to the contact electrode 16, and thus two or more nanocarbon-containing films 14 are electrically connected in parallel. Thereby, the resistance value in the stacked structure 10 can be effectively decreased compared to a case where a single layer of the nanocarbon-containing film 14 is connected to the contact electrode 16. Thus, the stacked structure 10 including two or more nanocarbon-containing films 14 has a structural advantage.

It is no longer necessary to form the contact electrodes 16 for each layer of the nanocarbon-containing films 14, which simplifies the process.

On the other hand, one of the problems when using nanocarbon for a resistor of a bolometer is that the resistance value is large, which may also result in an increase in a noise component. In order to improve the sensitivity of the bolometer, it is necessary to decrease the resistance value of a resistor using nanocarbon per unit area as far as possible. In the stacked structure 10 of this modification example, the plurality of nanocarbon-containing films 14 are arranged in the stacking direction, and the stacked end surface 10*e* and the contact electrode are electrically connected, thereby making it possible to arrange the nanocarbon-containing films 14 in parallel. As a result, when the stacked structure 10 includes two or more nanocarbon-containing films 14, it is possible to effectively decrease the resistance value of a resistor using nanocarbon per unit area.

Figure 13:
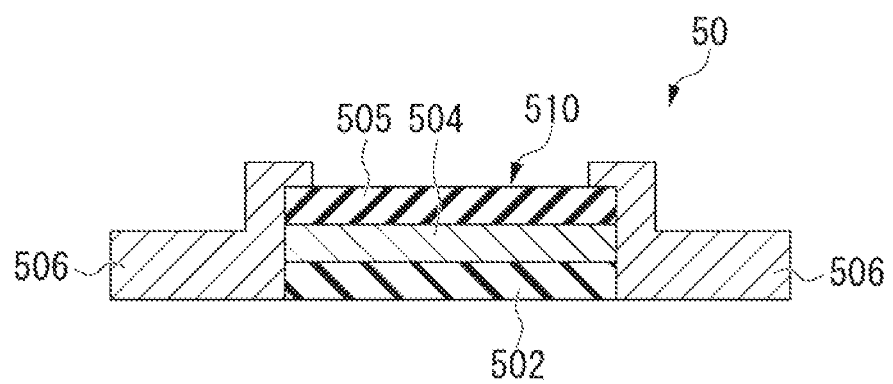
FIG. 13 is a cross-sectional view of stacked layers of a minimum configuration of an element in some example embodiments of the present disclosure.

Hereinafter some example embodiments according to the present disclosure will be described with reference to FIG. 13.

(Configuration)

An element 50 has a stacked structure 510 in which a first insulating layer 502, an intermediate layer 504 which is a nanocarbon-containing film, and a second insulating layer 505 are stacked in order, and which has a stacked end surface from which the intermediate layer is cut out, and includes a contact electrode 506 connected to the intermediate layer 504 at a layer end surface.

(Actions and Effects)

According to these example embodiments, an electrode is formed after forming a stacked structure including insulating layers as a first layer and a second layer, and further including nanocarbon in an intermediate layer between the two layers.

Thereby, the electrode can be formed with the surface of a nanocarbon-containing film covered with a second insulating layer, and thus it is possible to suppress the influence on the nanocarbon during the formation of the electrode.

Thus, it is easy to form the electrode connected to the nanocarbon-containing film.

Hereinafter some example embodiments according to the present disclosure will be described with reference to FIG. 14.

Figure 14:
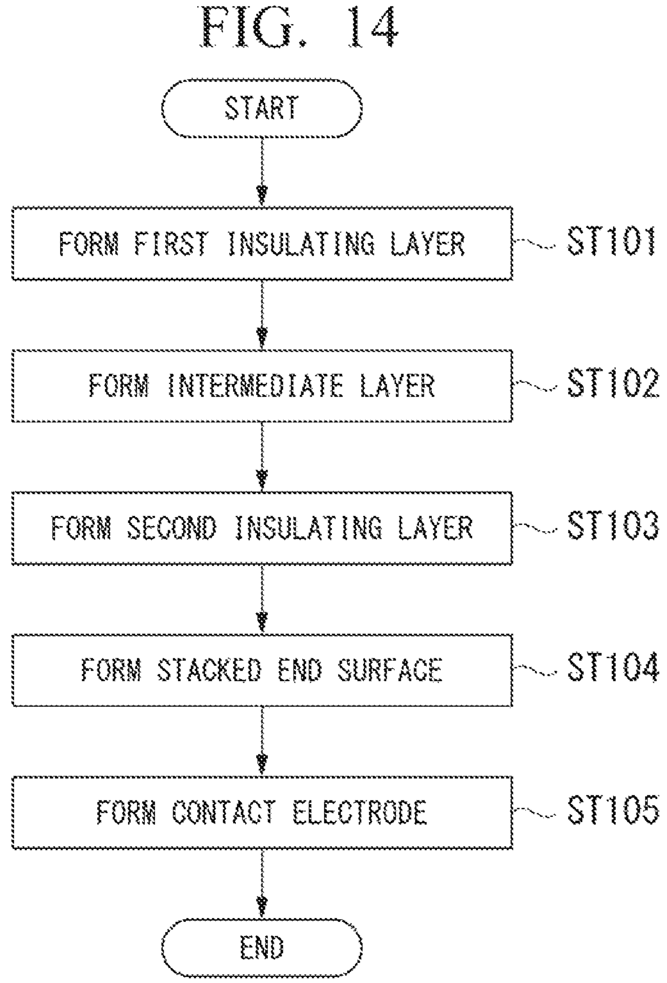
FIG. 14 is a flow diagram of a minimum configuration of a manufacturing method in some example embodiments of the present disclosure.

The element manufacturing method in these example embodiments is performed in accordance with a flow shown in FIG. 14.

The element manufacturing method includes a step of forming a first insulating layer (ST101), a step of stacking an intermediate layer containing nanocarbon on the first insulating layer (ST102), a step of stacking a second insulating layer on the intermediate layer (ST103), a step of forming a stacked end surface (ST104), and a step of forming a contact electrode connected to the intermediate layer at the stacked end surface (ST105).

(Actions and Effects)

According to the element manufacturing method of these example embodiments, an electrode is formed after forming a stacked structure including insulating layers as a first layer and a second layer, and further including nanocarbon in an intermediate layer between the two layers.

For this reason, an operator can form the electrode with the surface of a nanocarbon-containing film covered with a second insulating layer, and thus it is possible to suppress the influence on the nanocarbon during the formation of the electrode.

Thus, according to the element manufacturing method of the present disclosure, it is easy to form the electrode connected to the nanocarbon-containing film.

Although the example embodiments of the present disclosure have been described above, these example embodiments are shown as examples and are not intended to limit the scope of the disclosure. These example embodiments can be implemented in various other forms, and various omissions, substitutions, and changes can be made without departing from the gist of the present disclosure. These example embodiments and the modification example are included within the scope and gist of the present disclosure, as well as within the scope of the present disclosure and its equivalents. Each of the example embodiments can be combined with other example embodiments.

Hereinafter, the effects of the present disclosure will be described more specifically using an example. Conditions in the example are merely examples adopted to confirm the feasibility and effects of the present disclosure, and the present disclosure is not limited thereto. The present disclosure may adopt various conditions as long as the object of the present disclosure is achieved without departing from the gist of the present disclosure.

In FIG. 1, an element reported in this example has a specific size with some parts replaced as follows.

In the example, the first insulating layer 12 is a thermal oxide film.

In the example, the second insulating layer 15 is a silicon dioxide film sputtered in an atmosphere containing only Ar.

Figure 15:
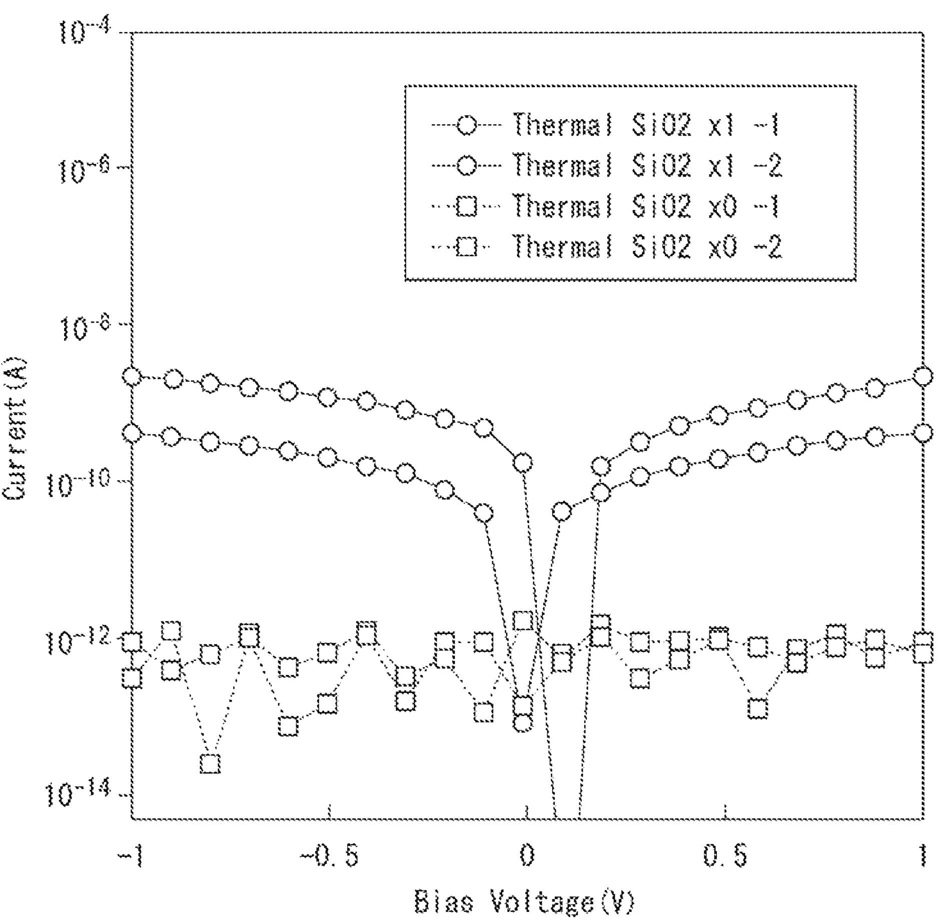
FIG. 15 is a graph showing comparison between electrical conductivity characteristics of elements depending on whether a nanocarbon-containing film is formed.

FIG. 15 is a diagram showing comparison between electrical conductivity characteristics of elements depending on whether a nanocarbon-containing film 14, which is a CNT network film, is formed.

The elements used were manufactured to have substantially the same structure except for whether the nanocarbon-containing film 14 is formed.

From FIG. 15, it was found that electrical conduction was allowed in samples in which the nanocarbon-containing film 14 was formed (Thermal SiO2 x1-1 and -2), as compared to samples in which the nanocarbon-containing film 14 was not formed (Thermal SiO2 x0-1 and -2).

Thereby, it was confirmed that the nanocarbon-containing film stacked on the thermal oxide film was electrically connected to a contact electrode.

Some or all of the above-described example embodiments may be as described in the following supplementary notes, but are not limited to the following.

(Supplementary Note 1)

An element including:

a first insulating layer;

an intermediate layer which is a nanocarbon-containing film;

a second insulating layer; and a contact electrode connected to an intermediate end surface which is an end surface of the intermediate layer, wherein the first insulating layer, the intermediate layer, and the second insulating layer are stacked in order.

(Supplementary Note 2)

The element according to supplementary note 1, wherein the intermediate layer is exposed toward the contact electrode between the first insulating layer and the second insulating layer on the stacked end surface.

(Supplementary Note 3)

The element according to supplementary note 1 or 2, wherein a first end surface which is an end surface of the first insulating layer, the intermediate end surface, and a second end surface which is an end surface of the second insulating layer are continuous on the stacked end surface.

(Supplementary Note 4)

The element according to any one of supplementary notes 1 to 4, wherein the contact electrode extends to overlap a surface of the second insulating layer.

(Supplementary Note 5)

The element according to any one of supplementary notes 1 to 4, wherein the intermediate layer includes semiconductor-type carbon nanotubes.

(Supplementary Note 6)

The element according to any one of supplementary notes 1 to 5, wherein the intermediate layer is stacked on the first insulating layer via a silane coupling agent.

(Supplementary Note 7)

A bolometer including:

the element according to any one of supplementary notes 1 to 6; and a substrate on which the element is disposed.

(Supplementary Note 8)

An element manufacturing method including:

forming a first insulating layer;

forming an intermediate layer which is a nanocarbon-containing film;

forming a second insulating layer; and forming a contact electrode connected to an intermediate end surface which is an end surface of the intermediate layer, wherein the first insulating layer, the intermediate layer, and the second insulating layer are stacked in order.

According to the element, the bolometer, and the element manufacturing method according to the present disclosure, it is easy to form an electrode connected to a nanocarbon-containing film.

What is claimed is:

1. An element comprising:

a first insulating layer;

an intermediate layer which is a nanocarbon-containing film;

a second insulating layer; and a contact electrode connected to an intermediate end surface which is an end surface of the intermediate layer, wherein the first insulating layer, the intermediate layer, and the second insulating layer are stacked in order, and wherein a first end surface which is an end surface of the first insulating layer, the intermediate end surface, and a second end surface which is an end surface of the second insulating layer are continuous.

2. The element according to claim 1, wherein the intermediate end surface is exposed toward the contact electrode between the first insulating layer and the second insulating layer.

3. The element according to claim 1, wherein the contact electrode extends to overlap a surface of the second insulating layer.

4. The element according to claim 1, wherein the intermediate layer includes semiconductor-type carbon nanotubes.

5. The element according to claim 1, wherein the intermediate layer is stacked on the first insulating layer via a silane coupling agent.

6. A bolometer comprising:

the element according to claim 1; and a substrate on which the element is disposed.

7. An element manufacturing method comprising:

forming a first insulating layer;

forming an intermediate layer which is a nanocarbon-containing film; and forming a second insulating layer, wherein the first insulating layer, the intermediate layer, and the second insulating layer are stacked in order, wherein the method further comprises forming a stacked end surface by cutting out the first insulating layer, the intermediate layer and the second insulating layer after forming the second insulating layer, and forming a contact electrode connected to an intermediate end surface which is an end surface of the intermediate layer in the stacked end surface after forming the stacked end surface, and wherein a first end surface which is an end surface of the first insulating layer, the intermediate end surface, and a second end surface which is an end surface of the second insulating layer are continuous on the stacked end surface.

8. The element manufacturing method according to claim 7, wherein the contact electrode extends to overlap a surface of the second insulating layer.

* * * * *